United States Patent
Tsukinoki

(10) Patent No.: US 8,369,977 B2
(45) Date of Patent: Feb. 5, 2013

(54) COATING AND DEVELOPING APPARATUS

(75) Inventor: Wataru Tsukinoki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 402 days.

(21) Appl. No.: 12/654,692

(22) Filed: Dec. 29, 2009

(65) Prior Publication Data

US 2010/0191362 A1    Jul. 29, 2010

(30) Foreign Application Priority Data

Jan. 23, 2009  (JP) ................................. 2009-013443

(51) Int. Cl.
*G06F 19/00* (2011.01)
(52) U.S. Cl. ...................................................... 700/114
(58) Field of Classification Search .................... 700/114
See application file for complete search history.

(56) References Cited

U.S. PATENT DOCUMENTS

| | | | | |
|---|---|---|---|---|
| 7,618,203 | B2 * | 11/2009 | Fujimaru et al. ............. | 396/611 |
| 7,840,299 | B2 * | 11/2010 | Higashi et al. ................ | 700/112 |
| 2005/0217581 | A1 * | 10/2005 | Higashi et al. ................ | 118/719 |
| 2006/0165409 | A1 * | 7/2006 | Akimoto et al. ............. | 396/611 |
| 2007/0293970 | A1 * | 12/2007 | Aiuchi et al. ................. | 700/114 |

FOREIGN PATENT DOCUMENTS

| | | | |
|---|---|---|---|
| JP | 2000-124301 | * | 4/2000 |
| JP | A-2000-124301 | | 4/2000 |
| JP | A-2004-193597 | | 7/2004 |
| JP | 2006-024684 | * | 1/2006 |
| JP | A-2006-24684 | | 1/2006 |
| JP | 2008-244072 | * | 10/2008 |
| JP | A-2008-244072 | | 10/2008 |

OTHER PUBLICATIONS

Office Action mailed Feb. 1, 2011 in corresponding JP patent application No. 2009-013443 (English translation enclosed).

\* cited by examiner

*Primary Examiner* — Mohammad Ali
*Assistant Examiner* — Sivalingam Sivanesan
(74) *Attorney, Agent, or Firm* — Posz Law Group, PLC

(57) ABSTRACT

A coating and developing apparatus includes: a delivery mounting unit on which a carrier housing a plurality of substrates is to be mounted and the carrier being accessed by a delivery mechanism; a plurality of retreat mounting units on which the carriers are to be mounted; a carrier carry mechanism moving and mounting the carriers between the retreat mounting units and the delivery mounting unit; a collection schedule creating function determining a collection order for collecting the substrates placed in modules into original carriers in which the substrates were housed, when a trouble occurs; and a carry control unit controlling to carry the substrates to the carriers in which the substrates were housed according to the determined collection order.

20 Claims, 16 Drawing Sheets

FIG.10

| CYCLE | TRS | CPL1 | BCT | CLH | CPL2 | COT | CPH | EXP1 | EXP2 | EXP3 | PEB | CPL3 | DEV | POST | CPL4 |
|---|---|---|---|---|---|---|---|---|---|---|---|---|---|---|---|
| ------ | | | | | | | | ------ | | | | | | | |
| n-1 | L6-1 | L5-3 | L5-2 | L5-1 | L4-3 | L4-2 | L4-1 | L3-3 | L3-2 | L3-1 | L2-3 | L2-2 | L2-1 | L1-3 | L1-2 |
| n | L6-2 | L6-1 | L5-3 | L5-2 | L5-1 | L4-3 | L4-2 | L4-1 | L3-3 | L3-2 | L3-1 | L2-3 | L2-2 | L2-1 | L1-3 |
| n+1 | L6-3 | L6-2 | L6-1 | L5-3 | L5-2 | L5-1 | L4-3 | L4-2 | L4-1 | L3-3 | L3-2 | L3-1 | L2-3 | L2-2 | L2-1 |
| ------ | | | | | | | | ------ | | | | | | | |

| CYCLE | FOUP | M1 | M2 | M3 | M4 | M5 | M6 |
|---|---|---|---|---|---|---|---|
| 0 | L1-1 | | | | | | |
| 1 | L1-2 | L1-1 | | | | | |
| 2 | L1-3 | L1-2 | L1-1 | | | | |
| 3 | L2-1 | L1-3 | L1-2 | L1-1 | | | |
| 4 | L2-2 | L2-1 | L1-3 | L1-2 | L1-1 | | |
| 5 | L2-3 | L2-2 | L2-1 | L1-3 | L1-2 | L1-1 | |
| 6 | L3-1 | L2-3 | L2-2 | L2-1 | L1-3 | L1-2 | L1-1 |
| 7 | L3-2 | L3-1 | L2-3 | L2-2 | L2-1 | L1-3 | L1-2 |
| 8 | L3-3 | L3-2 | L3-1 | L2-3 | L2-2 | L2-1 | L1-3 |
| 9 | L4-1 | L3-3 | L3-2 | L3-1 | L2-3 | L2-2 | L2-1 |
| | | | | L3-2 | L3-1 | L2-3 | L2-2 |
| | | | | | L3-2 | L3-1 | L2-3 |

COATING AND DEVELOPING APPARATUS

BACKGROUND OF THE INVENTION

1. Field of the Invention

The present invention relates to a coating and developing apparatus performing a coating treatment of a resist solution and a developing treatment after exposure, on a substrate such as a semiconductor wafer, an LCD substrate (a glass substrate for a liquid crystal display) or the like.

2. Description of the Related Art

In a manufacturing process of a semiconductor device and an LCD substrate, a resist pattern is formed on a substrate by a technique called photolithography. This technique is performed by a series of processes by applying a resist solution to a substrate such as a semiconductor wafer (hereinafter, referred to as a "wafer") to form a solution film on the front surface of the wafer, exposing the resist film to light using a photomask, and then performing a developing treatment thereon to obtain a desired pattern.

Such treatments are usually performed using a resist pattern forming system in which an aligner is connected to the coating and developing apparatus performing coating and development of the resist solution. In this system, for example, carriers 10 each housing many wafers therein are carried into a carrier stage 11 of a carrier mounting section 1A, and the wafers in the carriers 10 are delivered by a delivery arm 12 to a treatment section 1B as shown in FIG. 16. In the treatment section 1B, formation of an anti-reflection film in an anti-reflection film forming module (not shown) and formation of a resist film in a coating module 13 are performed on the wafers, and the wafers are then carried to an aligner 1D via an interface section 1C. On the other hand, the wafers after exposure processing are returned back to the treatment section 1B and subjected to a developing treatment in a developing module 14, and then returned back to the original carriers 10. Before and after the formation treatments of the anti-reflection film and the resist film and before and after the developing treatment, heating treatments and cooling treatments of the wafers are performed. Heating modules performing the heating treatments, cooling modules performing the cooling treatments and so on are arranged in multi tiers in shelf modules 15a to 15c, and the wafers are carried between the modules by main arms 16A and 16B provided in the treatment section 1B.

When the wafers are subjected to the above-described treatments, the wafers are carried according to a carry schedule (see FIG. 17) in which the timing when each wafer is carried to which module is determined in advance for all of the wafers to be treated as described in Japanese Patent Application Laid-open No. 2004-193597. The vertical axis of the carry schedule shows the cycle and the horizontal axis shows the module to which the wafer is to be carried. Note that FOUP is the carrier and M1 to M6 are the modules, and L1-1 means the first wafer in a lot L1, and L2-3 means the third wafer in a lot L2. In this case, one carrier is allocated to one lot, and three wafers are housed in one carrier in this example.

As described above, the carrier 10 is usually prepared for each lot for treatment, and the wafers taken out of one carrier to the treatment section 1B are subjected to predetermined treatment and processing in the treatment section 1B and the aligner 1D, and then housed in the original carrier 10. In this event, a plurality of, for example, four carriers 10 are mounted on the carrier stage 11 and, for example, the delivery arm 12 is configured to be accessible to all of the carriers 10. The vacant carrier 10 after the wafers therein have been taken out to the treatment section 1B is waiting on the carrier stage 11 until predetermined treatments and processing for the wafers are completed. Then, after the treated wafers W are returned into the four carriers 10, the carriers housing the treated wafers are exchanged with carriers housing untreated wafers. On the other hand, the throughput of the treatment section 1B and the aligner 1D is about 130 wafers per hour. The treatment section 1B and the aligner 1D are configured to be able to perform treatments and processing on, for example, 130 wafers at the same time, Incidentally, manufacturing of a wide variety of products in small quantities by one coating and developing apparatus is required in recent years. In this case, one carrier is allocated to one kind of products, and therefore the number of wafers housed in one carrier is decreased. Accordingly, in the method of performing all of the treatments on the wafers W in the four carriers 10, returning the treated wafers W back to the original carriers 10, and then exchanging the carriers with new carriers as has been described, the total number of wafers W taken out of all of the carriers 10 mounted on the carrier stage 11 to the treatment section 1B is decreased. Therefore, in the treatment section 1B and the aligner 1D, the wafers are not supplied to all of the modules which could normally perform treatments, resulting in a reduction in throughput.

Therefore, the present inventors have studied provision of a stocker temporarily storing the carriers separately from the carrier stage so that even when the number of wafers housed in one carrier is small, the total number of wafers to be taken out of all of the carriers mounted on the carrier stage to the treatment section is increased by taking the wafers out of one carrier, then retreating the carrier to the stocker, and mounting a new carrier on the carrier stage and taking the wafers out of it, so as to increase the operating rate of the modules in the treatment section and the aligner, thereby suppressing the reduction in throughput.

Incidentally, in the above-described coating and developing apparatus, when the wafers cannot be carried according to the above-described carry schedule due to a failure or the like of the modules or the carry mechanism, an alarm is outputted to shut down the apparatus after the wafers are collected. In this event, the wafers W in the treatment section and the aligner are immediately collected from the modules in which the wafers W are placed at the trouble to the original carriers.

If the stocker is not provided here as in the prior art, all of the wafers placed in the treatment section and the aligner are housed into the carriers provided on the carrier stage, so that the collection work can be quickly performed. However, in the structure in which the stocker for the carriers is provided, a situation that the original carrier to which the wafers W are to be returned does not exist on the carrier stage when trouble occurs may happen, thus generating confusion in the collection work.

SUMMARY OF THE INVENTION

The present invention has been made in consideration of such circumstances, and its object is to provide a technique of quickly collecting substrates when trouble occurs in the apparatus.

To this end, the coating and developing apparatus of the present invention is a coating and developing apparatus forming a coating film on each of substrates taken out of carriers, each carrier housing a plurality of substrates and being prepared for each lot, performing developing treatment on the substrates after exposure, and carrying the substrates which have been subjected to the developing treatment back to original carriers in which the substrates were housed, the apparatus including: a treatment section comprising a plurality of modules treating the substrates taken out of the carriers, and a substrate carry mechanism carrying the substrates between the plurality of modules; a carrier mounting section comprising a delivery mounting unit on which the carrier is to be mounted, and a delivery mechanism delivering the substrates between the carrier mounted on the delivery mounting unit and the treatment section; a plurality of retreat mounting units provided in the carrier mounting section, on which the carriers are to be mounted; a carrier carry mechanism moving and mounting the carriers between the retreat mounting units and the delivery mounting unit; a collection control unit determining a collection order for collecting the substrates in the modules into the original carriers in which the substrates were housed, when a trouble occurs in the coating and developing apparatus; and a carry control unit controlling the carrier carry mechanism to move and mount the carriers between the delivery mounting unit and the retreat mounting units according to the determined collection order, and controlling the delivery mechanism and the substrate carry mechanism to carry the substrates to the carrier in which the substrates were housed on the delivery mounting unit according to the determined collection order.

According to the present invention, when a trouble occurs in the coating and developing apparatus, the order of collecting the substrates placed in the modules in the treatment section when the trouble occurs to the original carriers is determined, and the carriers are moved between the delivery mounting unit and the retreat mounting units and mounted thereon according to the collection order, so that the substrates can be quickly collected when trouble occurs in the apparatus.

BRIEF DESCRIPTION OF THE DRAWINGS

FIG. 10 is an explanatory diagram showing one example of a carry schedule used in the resist pattern forming system;

DETAILED DESCRIPTION OF THE INVENTION

Figure 1:
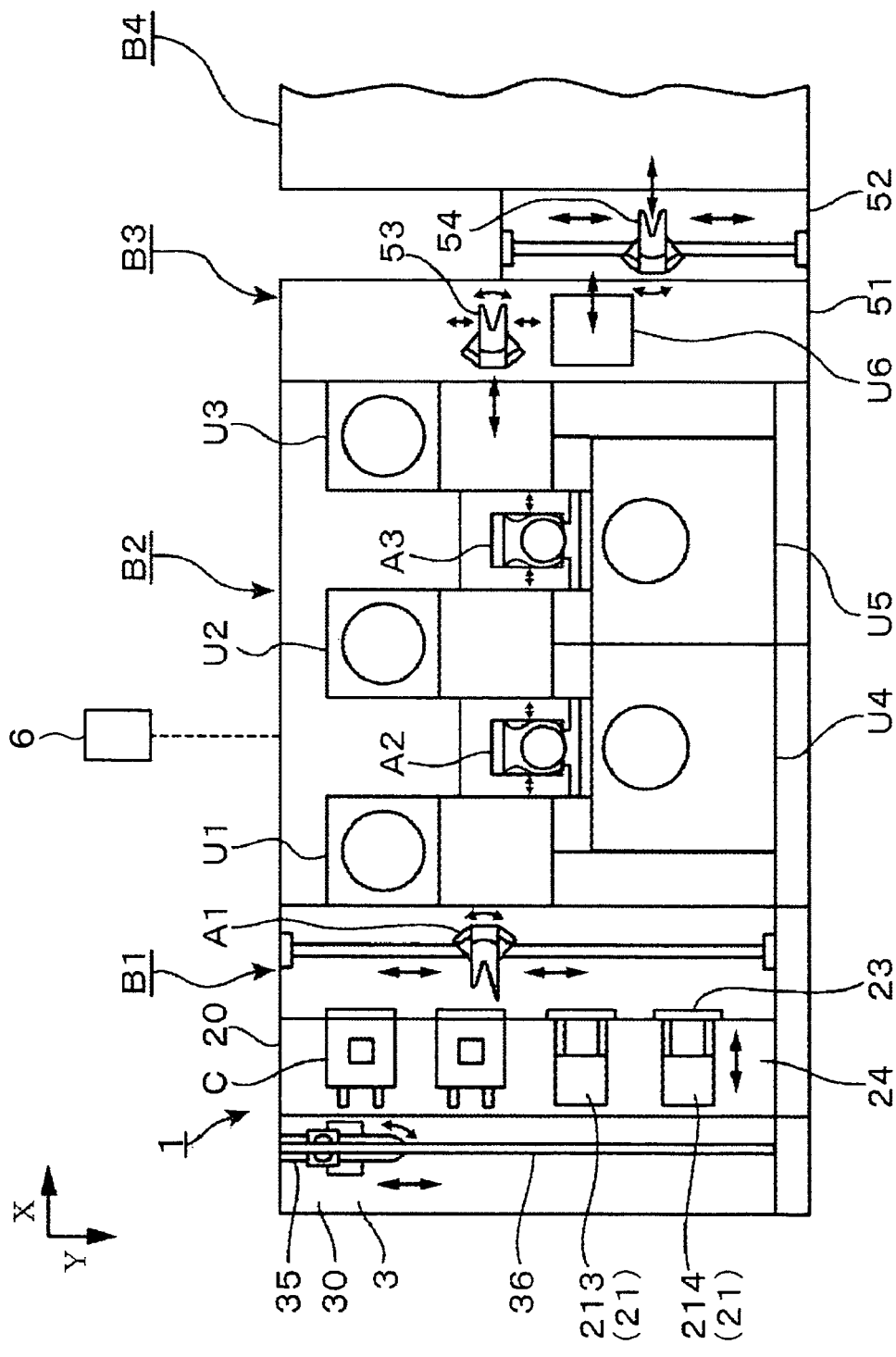
FIG. 1 is a plan view showing an embodiment of a resist pattern forming system according to the present invention.
Figure 2:
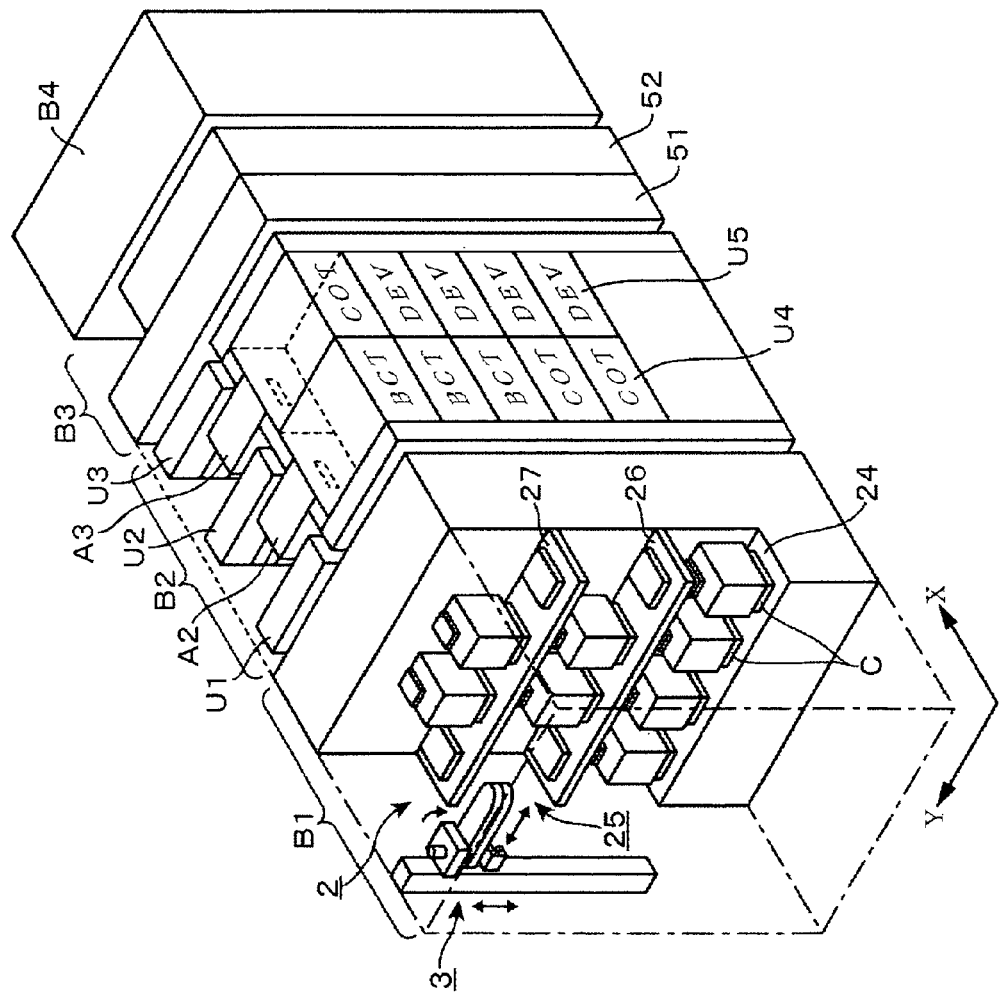
FIG. 2 is a perspective view showing the resist pattern forming system.
Figure 3:
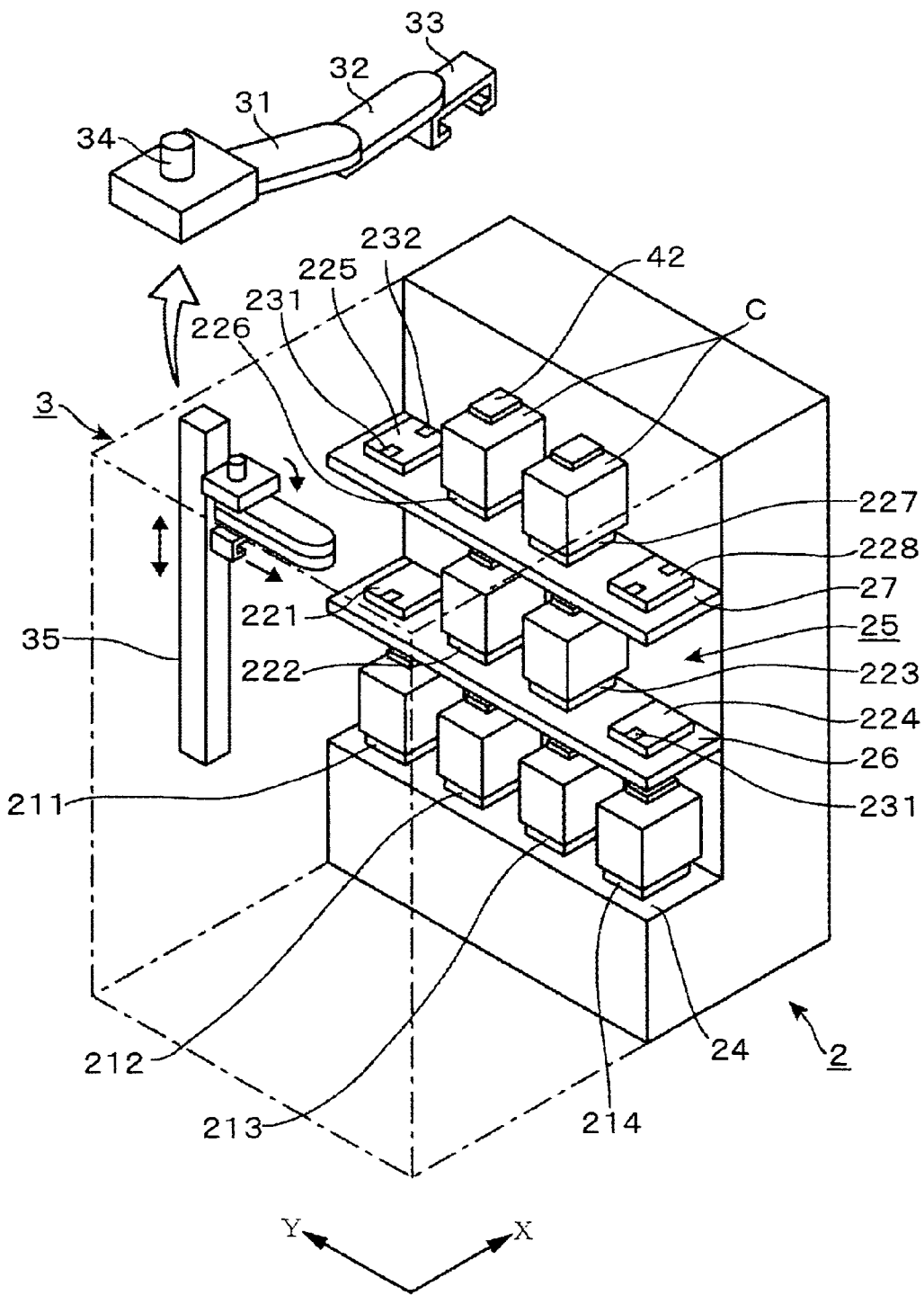
FIG. 3 is a perspective view showing a carrier mounting section in the resist pattern forming system.

A resist pattern forming system 1 in which an aligner is connected to a coating and developing apparatus of the present invention will be described first referring to the drawings. FIG. 1 shows a plan view of one embodiment of the system, and FIG. 2 is a schematic perspective view of the system. B1 in the drawings denotes a carrier mounting section for carrying in/out carriers C in each of which, for example, 13 substrates, for example, wafers W are hermetically housed. B2 denotes a treatment section for performing coating and developing treatments on the wafer W, B3 denotes an interface section, and B4 denotes an aligner. In the carrier mounting section B1, for example, a carrier station 2 in which delivery mounting units 21 (211 to 214) and retreat mounting units 22 (221 to 228) for the carriers C are provided in multiple tiers as shown in FIG. 3; open/close units 23 provided in a wall surface located ahead as seen from the carrier station 2; and a delivery mechanism A1 for taking a wafer W from the carrier C mounted on the delivery mounting unit 21 and delivering the wafer W to the later-described treatment section B2, are provided. The carrier mounting section B1 is enclosed, for example, by a casing 20.

The carrier station 2 includes, for example, a mounting stage 24 on which a plurality of delivery mounting units 21 (211 to 214) are provided, and a stocker 25 provided above the mounting stage 24 and forming a storage unit for temporarily storing the carriers C. The stocker 25 includes shelf units 26 and 27 provided in a plurality of, for example, two tiers. The delivery mounting units 21 are mounting units accessed by the delivery mechanism A1, and a plurality of, for example, four delivery mounting units 21 are arranged on the mounting stage 24 side by side in a Y-direction in the drawing and allowing the mounted carriers C to be fixed thereon. Further, the delivery mounting units 21 are configured to be slidable in an X-direction in the drawings, so that not-shown wafer take-out ports provided on the carriers C can be connected to the open/close units 23.

In this example, for example, two delivery mounting units 211 and 212 among the delivery mounting units 211 to 214 on the mounting stage 24 are allocated as carry-in delivery mounting units for delivering the wafers W from the carriers C to the treatment section B2. Further, the remaining two delivery mounting units 213 and 214 are allocated as carry-out delivery mounting units for returning the wafers W from the treatment section B2 back into the carriers. Furthermore, the delivery mechanism A1 is configured to be movable in the Y-direction, movable backward and forward, and rotatable around the vertical axis in order to deliver the wafers W to the four delivery mounting units 211 to 214.

Further, many mounting units for mounting the carriers C thereon and temporarily storing them are arranged in the stocker 25. In this example, the mounting units in the stocker 25 also serve as the retreat mounting units 22. As the retreat mounting units 22, a plurality of, for example, four mounting units 221 to 224 are arranged side by side in the Y-direction, for example, on the shelf unit 26 on the lower tier side in the stocker 25, and a plurality of, for example, four mounting units 225 to 228 are arranged side by side in the Y-direction on the shelf unit 27 on the upper tier side. Among the retreat mounting units 225 to 228 on the upper tier side, for example, two retreat mounting units 225 and 226 are used here as the carry-in mounting units on which the carriers C will be mounted when the carriers C are carried from the external part into the coating and developing apparatus. Further, the remaining two retreat mounting units 227 and 228 also serve as the carry-out mounting units on which the carriers C will be mounted when the carriers C are carried from the coating and developing apparatus to the external part. The carry-in mounting units 225 and 226 and the carry-out mounting units 227 and 228 correspond to the carry-in/out mounting units of the present invention. Further, these retreat mounting units 221 to 228 are configured such that the carriers C are mounted and fixed thereon.

Figure 4:
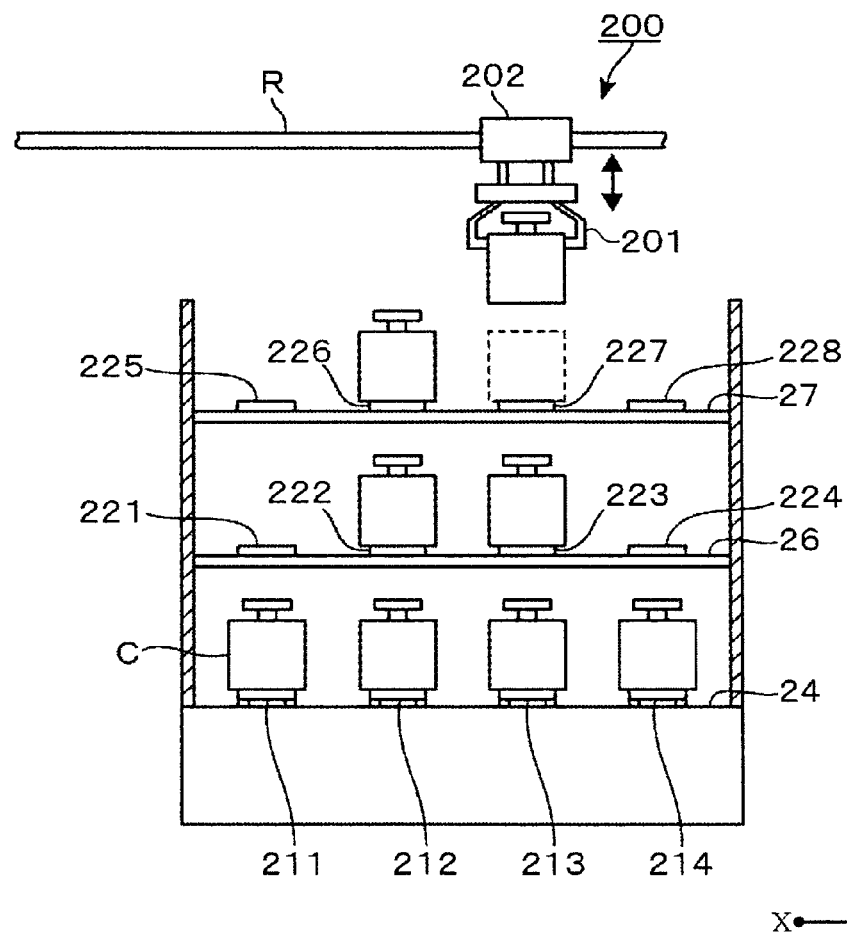
FIG. 4 is a front view of the carrier mounting section seen from the side of the carrier carry mechanism.

As shown in FIG. 4, above the shelf units 27 on the upper tier side, a rail R extending in the Y-direction in the drawing is provided. On the rail R, an external carrier carry mechanism 200 is provided which carries the carrier C between the coating and developing apparatus and another treatment apparatus in the external part. The external carrier carry mechanism 200 includes a grip unit 201 holding the carrier C, and the grip unit 201 is configured to support the carrier C in a manner so as to grip sides of the carrier C in the lateral direction. Further, the external carrier carry mechanism 200 is configured to be movable along the rail R, and is configured to be movable in the vertical direction so as to mount the carriers C on the carry-in mounting units 225 and 226 and the carry-out mounting units 227 and 228 on the shelf unit 27 on the upper tier side and to receive the carriers C from the carry-in mounting units 225 and 226 and the carry-out mounting units 227 and 228 by means of a lift mechanism 202.

Further, the carrier mounting section B1 includes a carrier carry mechanism 3 for delivering the carrier C to/from each of the mounting sections 21 and 22 in the carrier station 2 as shown in FIG. 1 to FIG. 3. The carrier carry mechanism 3 is an articulated arm composed of, for example, a first arm 31, a second arm 32, and a holding arm 33, and is configured to be movable backward and forward and rotatable around the vertical axis by means of a rotation mechanism 34.

Figure 5:
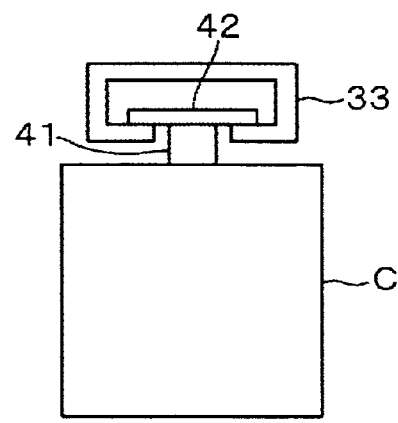
FIG. 5 is a front view showing a carrier.

Explaining here the shape of the carrier C, a plate-shape holding plate 42 is provided on an upper surface of the carrier C via a support part 41 as shown in FIG. 2 to FIG. 5. The holding arm 33 is configured, for example, to surround the holding plate 42 of the carrier C so as to support the carrier C in a hanging state as shown in FIG. 5.

Such a carrier carry mechanism 3 is configured to freely lift up and down along a lift shaft 35, and the lift shaft 35 is configured to be movable along a guide rail 36 provided extending in the Y-direction in FIG. 1, for example, at the ceiling portion of the carrier mounting section B1. Thus, the carrier carry mechanism 3 is configured to move and mount the carrier C to and on each of the delivery mounting units 211 to 214 and the retreat mounting units 221 to 228 in the carrier station 2. Further, the carrier carry mechanism 3 is configured to move to a retreat region 30 when it is not performing the moving and mounting work for the carrier C. The retreat region 30 is provided at a position where it does not interfere with a moving region of an operator when the operator conveys and mounts a carrier C directly into the carrier station 2 as described later. Concretely, the retreat region 30 is provided, for example, on one of the sides in the lateral direction of the carrier station 2 when the carrier station 2 is seen from the carrier carry mechanism 3 side, as shown in FIG. 1.

Such delivery mounting units 211 to 214 and the retreat mounting units 225 to 228 on the upper tier are provided, for example, with position sensors 231 each for verifying the mounting position of the carrier C and presence sensors 232 each for verifying the presence of the carrier C as shown in FIG. 3. The retreat mounting units 221 to 224 on the middle tier are provided with the position sensors 231. As each of the position sensors 231 and the presence sensors 232, a reflection-type photosensor, a sensor sensing movement of a striker which detects the position and the presence of a carrier C when the carrier C is mounted on the mounting unit 211 to 214, 221 to 228, by bumping into the bottom portion of the carrier C, or the like is used.

To the back side of the carrier mounting section B1, the treatment section B2 is connected. In the treatment section B2, shelf modules U1 to U3 in which heating and cooling system modules are multi-tiered, solution treatment modules U4 and U5, and main arms A2 and A3 constituting a substrate carry mechanism delivering the wafer W between the modules in the shelf modules U1 to U3 and the solution treatment modules U4 and U5, are provided in order from the side closer to the carrier mounting section B1. The shelf modules U1 to U3 and the main arms A2 and A3 are located in an alternate arrangement manner. More specifically, the shelf modules U1, U2, and U3 and the main arms A2 and A3 are arranged one after the other in one line as seen from the carrier mounting section B1 side, and not-shown openings for carrying the wafer are provided at connection regions between them. Thus, the wafer W can be freely moved from the shelf module U1 on one end side to the shelf module U3 on the other end side in the treatment section B2.

The shelf modules U1 to U3 are configured such that various modules for performing pre-treatment and post-treatment of the treatments performed in the solution treatment modules U4 and U5 are stacked in a plurality of tiers, for example, 10 tiers. The shelf modules U1 to U3 include a delivery module TRS, temperature regulating modules CPL each for regulating the wafer W to a predetermined temperature, heating modules CLH each for performing heating treatment on the wafer W, heating modules CPH each for performing heating treatment on the wafer W after a resist solution is applied, heating modules PEB each for performing heating treatment on the wafer W before developing treatment, heating modules POST each for performing heating treatment on the wafer W after developing treatment and so on.

The solution treatment modules U4 and U5 are configured such that anti-reflection film forming modules BCT each for applying chemical for forming an anti-reflection film to the wafer W, coating modules COT each for applying a resist solution to the wafer W, developing modules DEV each for supplying a developing solution to the wafer W to develop it and so on are stacked in a plurality of tiers, for example, five tiers as shown in FIG. 2. The wafer W is mounted in each of the modules in the shelf modules U1 to U3 and the solution treatment modules U4 and U5 and subjected to a predetermined treatment.

To the side of the shelf module U3 of the treatment section B2 opposite the carrier mounting section B1, the aligner B4 is connected via the interface section B3. The interface section B3 is composed of a first carry chamber 51 and a second carry chamber 52 which are provided one after the other between the treatment section B2 and the aligner B4. The first carry chamber 51 and the second carry chamber 52 include a first carry arm 53 and a second carry arm 54 which can lift up and down, rotate around the vertical axis, and move backward and forward, respectively. Furthermore, in the first carry chamber 51, a shelf module U6 is provided in which, for example, delivery modules and so on are stacked one on the other.

The main arms A2 and A3 are configured to deliver the wafer between all of the modules in the treatment section B2, that is, the modules in the shelf modules U1 to U3 and the modules in the solution treatment modules U4 and U5. Thus, the main arms A2 and A3 are configured to be able to move backward and forward, lift up and down, rotate around the vertical axis, and move in the Y-axis direction. Each of the main arms A2 and A3 includes two holding arms each for supporting a peripheral region on a rear surface side of the wafer W, and the these holding arms are configured to move backward and forward independently of each other.

Figure 6:
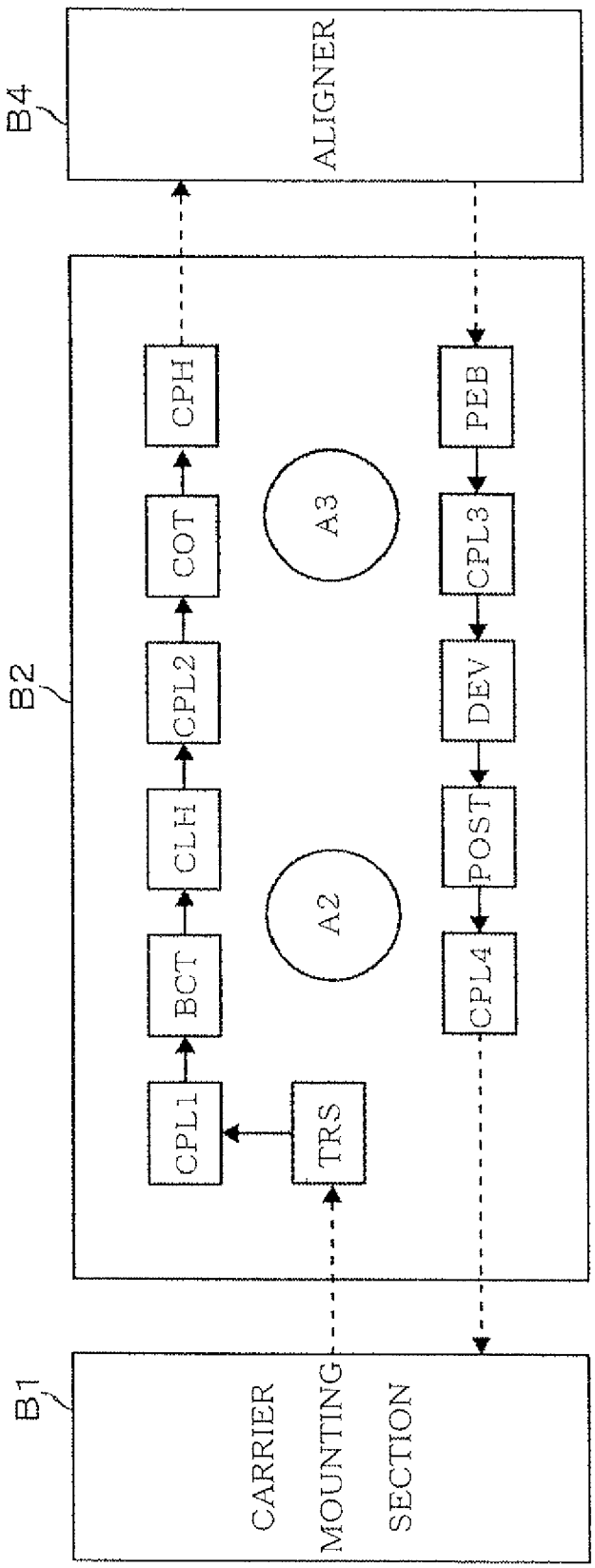
FIG. 6 is a plan view showing a carry passage of a wafer W in a treatment section in the resist pattern forming system.

Explaining one example of the flow of the wafer W in the above-described resist pattern forming system referring to FIG. 6, the wafer W in the carrier C mounted on the mounting unit 211 in the carrier mounting section B1 is delivered to the delivery module TRS in the shelf module U1 in the treatment section B2, and carried from the delivery module TRS through a passage of the temperature regulating module CPL1, the anti-reflection film forming module BCT, the heating module CLH, the temperature regulating module CPL2, the coating module COT, the heating module CPH, the interface section B3, and the aligner B4, and subjected to exposure processing in the aligner B4. On the other hand, the wafer W after exposure processing is returned back to the treatment section B2, and carried through a passage of the heating module PEB, the temperature regulating module CPL3, the developing module DEV, the heating module POST, and the temperature regulating module CPL4, and returned from the temperature regulating module CPL4 back to the carrier C in the carrier mounting section B1.

In this event, the main arms A2 and A3 receive the wafers from the delivery module TRS in the shelf module U1 in the treatment section B2, and carry the wafers along the carry passage which has been already described via the temperature regulating module CPL and so on sequentially to the heating module CPH. The main arms A2 and A3 then receive the exposed wafers W from the interface section B3, and carry the wafers W one by one placed in the modules from the downstream module to the upstream module, that is, from the module located on the aligner B4 side toward the module located on the carrier mounting section B1 side in the treatment section B2 so that the main arms A2 and A3 carry the wafers W along the carry passage which has been already described via the heating module PEB and so on sequentially to the delivery module TRS. More specifically, the main arms A2 and A3 are controlled to perform a series of operations, that is, a carry cycle, of carrying the wafers W delivered from the carrier mounting section B1 to the delivery module TRS in the treatment section B2, sequentially along the carry passage and returning the wafers W back to the delivery module TRS.

The above-described resist pattern forming system 1 includes a control unit 6 composed of a computer which performs management of recipes of the treatment modules, management of the recipe of the carry passage of the wafer W, that is, the carry flow, the treatments in the treatment modules, and drive control of the external carrier carry mechanism 200, the carrier carry mechanism 3, the delivery mechanism A1, the main arms A2 and A3 and so on. The control unit 6 has a program storage unit composed, for example, of computer programs. In the program storage unit, stored are programs composed of, for example, software including commands, that is, a step command group in order to implement the operation of the whole resist pattern forming system 1, that is, the treatments in the modules and the carriage of the wafers W and so on to form a predetermined resist pattern on the wafer W. Then, the programs are read out to the control unit 6, whereby the operation of the whole resist pattern forming system 1 is controlled by the control unit 6. Note that the programs are stored in the program storage unit in the state that they are held, for example, in a storage medium such as a flexible disk, a hard disk, a compact disk, a magneto-optical disk, a memory card or the like.

Figure 7:
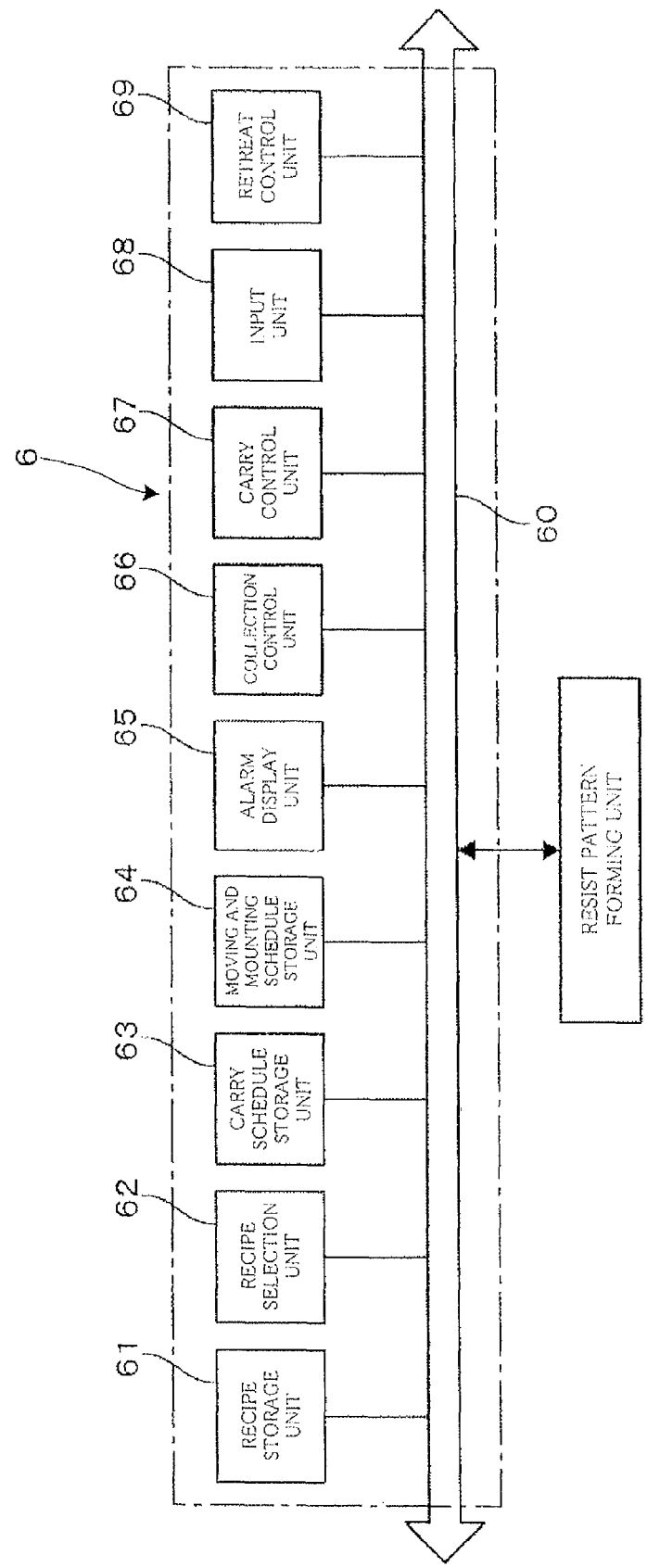
FIG. 7 is a configuration diagram showing a part of a control unit in the resist pattern forming system.

FIG. 7 shows the configuration of the control unit, which is actually composed of a CPU, programs, and a memory and so on. In the present invention, the control unit is characteristic by collection of wafers when trouble occurs, and therefore the control unit will be described with part of components relating to the collection of wafers divided into blocks. A numeral 60 in FIG. 7 denotes a bus to which a recipe storage unit 61, a recipe selection unit 62, a carry schedule storage unit 63, a moving and mounting schedule storage unit 64, an alarm display unit 65, a collection control unit 66, a carry control unit 67, an input unit 68, and a retreat control unit 69 are connected.

The recipe storage unit 61 stores, for example, a carry recipe in which the carry passage of the wafer W is stored, and a plurality of recipes in which conditions of treatments performed on the wafer W are recorded. The carry schedule storage unit 63 is a mechanism corresponding to a memory unit, and is a device for storing a schedule of contents such as the timings when all of the wafers in a lot are carried to which units based on the carry recipe, for example, a carry schedule created by assigning numbers of order to the wafers and arranging data of the carry cycles in which the order numbers of the wafers and the modules are associated, in time sequence.

The moving and mounting schedule storage unit 64 is a device for storing the moving and mounting schedule of the carriers C in the carrier station 2. Here, addresses are given to the delivery mounting units 211 to 214 and the retreat mounting units 221 to 228, respectively, and unique IDs are also given to the carriers C respectively. In this moving and mounting schedule, the carriers C and the delivery mounting units 211 to 214 and the retreat mounting units 221 to 228 are associated in time sequence, and the timings when which of the carrier C is moved to and mounted in which of the mounting units 211 to 214 and 221 to 228 are written in time sequence.

The alarm display unit 65 is a mechanism for displaying an alarm when any trouble occurs in the system. The trouble here refers to the case where the wafers W cannot be carried according to the carry schedule due to occurrence of an abnormal condition of the various modules or the aligner B4, an abnormal condition of the main arm A2, A3 or the delivery mechanism A1 or the like. Further, the alarm display includes generation of an alarm sound, lighting of an alarm lamp, and an alarm display on a later-described input screen.

The collection control unit 66 is a control mechanism executing the collection work for collecting the wafers W under treatment into the corresponding original carriers C. The collection control unit 66 includes a collection schedule creating function determining, based on the carry schedule, the order to collect the wafers W from the modules in which the wafers W are placed to the respective original carriers, that is, the carrier in which the wafer W was housed before the wafer W is delivered to the treatment section B2, when the trouble occurs. The collection control unit 66 is configured to execute the collection work based on an instruction by the operator when a trouble occurs in the system. The collection work will be described later. The carry control unit 67 is a device for controlling the carrier carry mechanism 3, the delivery mechanism A1, the main arms A2 and A3 and so on, and is configured to execute a predetermined carry operation referring to the carry schedule, the moving and mounting schedule and the collection schedule. The input unit 68 is a device including the input screen and configured such that a collection instruction, a collection instruction and so on by the operator can be inputted. The alarm display is also displayed on the input screen. Note that the retreat control unit 69 will be described later.

Figure 8:
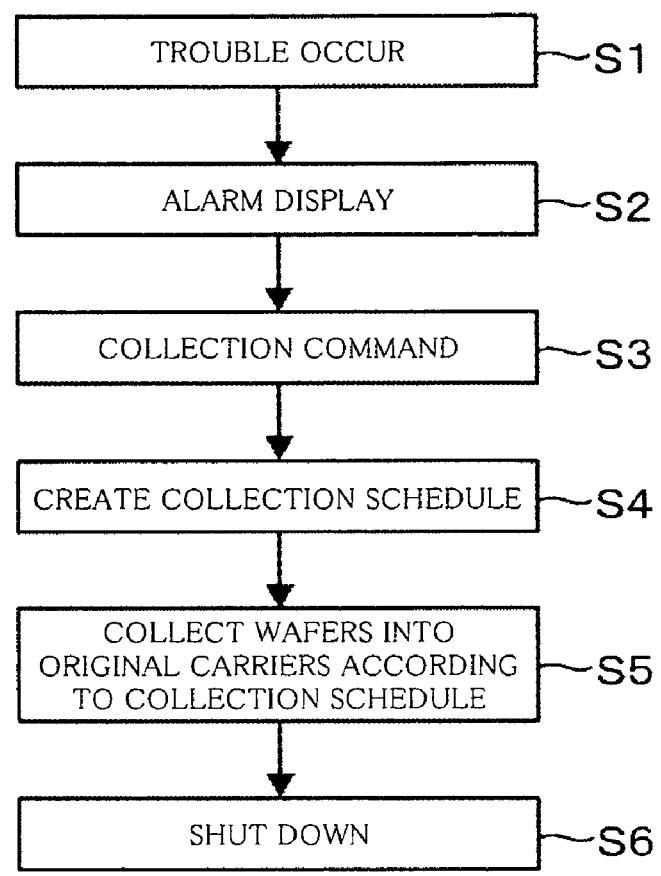
FIG. 8 is a flowchart for explaining the operation of the resist pattern forming system.

Subsequently, the operation of this embodiment will be described referring to FIG. 8 and FIG. 9. Prior to start of the treatment on the wafers W being substrates, the operator selects a recipe. As has been described, a case in which an anti-reflection film is formed and a resist film is formed thereon, as the coating film, will be described here. The operator first selects a recipe for the case of forming the coating film including the anti-reflection film and the resist film, and a carry schedule and a moving and mounting schedule for the wafers in the lots L1 to L8. In this event, it is assumed that three wafers are housed in each of the lots L1 to L8, and that the wafers W are taken out of the carriers C mounted in the carrier mounting section B1 to the treatment section B2 in the order of the lot L1, the lot L2, the lot L3, the lot L4, the lot L5, the lot L6, the lot L7, and the lot L8. Then, the control unit 6 outputs an instruction to the delivery mechanism A1, the main arms A2 and A3 and so on referring to the selected carry schedule and moving and mounting schedule to take the wafers out to the treatment section B2 starting from the lot L1 and execute treatments thereon.

In this event, in the carrier mounting section B1, the external carrier carry mechanism 200 first carries the carriers C starting from the carrier C1 for the lot L1, the carrier C2 for the lot L2, the carrier C3 for the lot L3, the carrier C4 for the lot L4, the carrier C5 for the lot L5, the carrier C6 for the lot L6, the carrier C7 for the lot L7, and the carrier C8 for the lot L8 in sequence into the carry-in mounting units 225 and 226. Then, the carrier carry mechanism 3 moves and mounts the carriers C1 to C8 to the other retreat mounting units 221 to 224, 227, 228 or the carry-in delivery mounting units 211, 212 in the stocker 25 according to the moving and mounting schedule.

After the carrier C1 is mounted on the carry-in delivery mounting unit 211 and its lid body is opened, wafers L1-1 to L1-3 in the carrier C1 are received by the delivery arm A1 and taken out to the treatment section B2. The wafer L1-1 here means the first wafer in the lot L1, and the wafer L1-3 means the third wafer in the lot L1.

Subsequently, based on the moving and mounting schedule, the carrier carry mechanism 3 moves and mounts the next carrier C2, for example, to and on the carry-in delivery mounting unit 212, and the delivery arm A1 takes wafers L2-1 to L2-3 in the carrier C2 out to the treatment section B2. In this manner, the carriers C are moved to and mounted on one of the carry-in delivery mounting units 211 and 212 in the order of the carrier C3, the carrier C4, the carrier C5, the carrier C6, the carrier C7, and the carrier C8, and the wafers W therein are then taken out to the treatment section B2 by the delivery arm A1 in sequence to the treatment section B2. The vacant carriers C after the wafers W are taken out of them are moved to and mounted on the retreat mounting units 221 to 228 which are predetermined by the moving and mounting schedule, and next carriers are carried into the carry-in delivery mounting units 211 and 212.

On the other hand, in the treatment section B2, the main arms A2 and A3 carry the wafers starting from the wafer L1-1 in the carrier C1 to the predetermined module according to the carry schedule. The main arms A2 and A3 here execute one cycle, that is, the carry cycle, in which two or more holding arms sequentially shift the wafers starting from the wafer in the module downstream in the carry passage to the next module in the order, thereby forming a state in which the wafer assigned a smaller order number is located in the module downstream in the carry passage from the module of the wafer assigned a larger order number as has been described. Then, after completion of the carry cycle, the main arms A2 and A3 shift to the next carry cycle and execute each cycle in sequence, whereby the wafers are sequentially carried to the modules along the above-described passage and subjected to predetermined treatments.

The wafers in the carrier C1 for which treatments have been completed are returned by the delivery mechanism A1 into the original carrier C1 mounted on the carry-out delivery mounting unit 213 or 214. The carrier C1 here has been moved and mounted by the carrier carry mechanism 3 through a passage of the carry-in delivery mounting unit 211, the retreat mounting unit 22, and the carry-out delivery mounting unit 213 in the carrier station 2 according to the moving and mounting schedule. In this manner, the wafers W in the carriers C2 to C8 after completion of treatments are also returned sequentially into the respective original carriers C2 to C8 which have been moved to and mounted on the carry-out delivery mounting units 213 and 214.

Next, the collection work of the wafers W when trouble occurs will be described referring to FIG. 8. When any trouble occurs in the system (Step S1), the alarm display unit 65 performs a predetermined alarm display (Step S2). Based on that, the operator issues a collection command to the collection control unit 66 via the input unit 68 (Step S3).

In this collection control unit 66, the collection schedule creating function creates a collection schedule for returning the wafers existing in the treatment section B2 to the carriers C, for example, referring to the carry schedule. Because the wafers of which lots being placed in which modules when the trouble occurs are recognized by the carry schedule, the collection schedule is created by determining the collection order to return the wafers W into the carriers C in sequence, for example, starting from the wafers W in the lot closer to the carrier mounting section B1 (Step S4).

Figure 9:
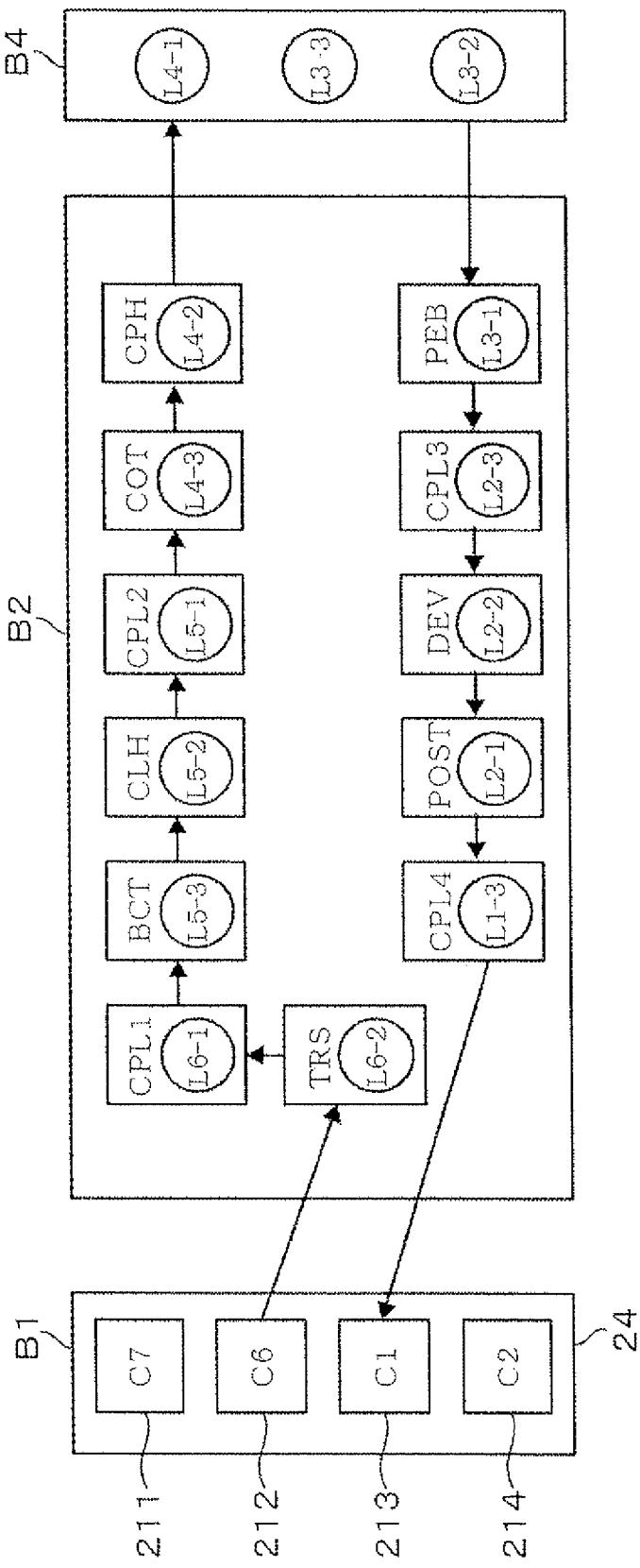
FIG. 9 is a plan view for explaining the operation of the resist pattern forming system.

The collection schedule will be concretely described referring to FIG. 9. The example in FIG. 9 shows a state in which the carrier C7 for the lot L7 and the carrier C6 for the lot L6 are mounted on the carry-in delivery mounting units 211 and 212 respectively, and the carrier C1 for the lot L1 and the carrier C2 for the lot L2 are mounted on the carry-out delivery mounting units 213 and 214 respectively in the carrier mounting section B1, and the second wafer L6-2 in the lot L6 is placed in the TRS module, the first wafer L6-1 in the lot L6 is placed in the CPL1 module, the third wafer L1-3 in the lot L1 is placed in the CPL4 module, and the first wafer L2-1 in the lot L2 is placed in the POST module. The carry schedule in this event is, for example, as shown in FIG. 10, and the state shown in FIG. 9 corresponds to an n-th cycle in this carry schedule.

In the carry cycle in an n+1-th cycle, the wafer L1-3 in the CPL 4 module is returned into the carrier C1, and the wafer L6-3 is taken out of the carrier C6 to the TRS module. The modules close to the carrier mounting section B1 are the CPL4 module and the TRS module as described above, and therefore the collection order is determined to perform the collection of the wafers in the order of, for example, the lot L1, the lot L6, the lot L5, the lot L2, the lot L4, and the lot L3. The collection schedule is created designating the main arm A2, A3 for use and the carry passage when the wafer W is delivered between the main arms A2 and A3.

After creation of the collection schedule, the carry control unit 67 controls the delivery mechanism A1 and the main arms A2 and A3 and so on referring to the collection schedule to collect the wafers W into the corresponding original carriers (Step S5). Because the positions of the carriers C in the carrier station 2 when the trouble occurs are recognized by the moving and mounting schedule in this event, the wafer W is just delivered to the corresponding carrier C if the target carrier C to which the wafer W is to be collected is mounted on the carry-in delivery mounting unit 211, 212 or the carry-out delivery mounting unit 213, 214. On the other hand, if the target carrier C is not mounted on the mounting unit 211 to 214, the carry control unit 67 controls the carrier carry mechanism 3 referring to the collection schedule to perform the moving and mounting work of the carriers C so as to mount the target carrier C onto the mounting unit 211 to 214.

Figure 11A:
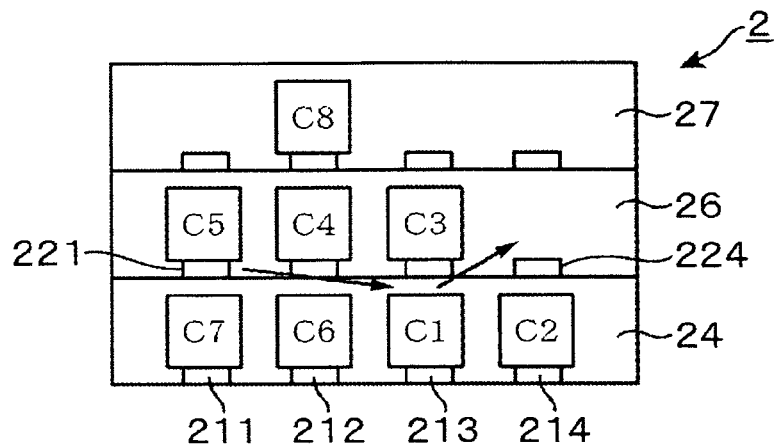
FIG. 11A is a process chart showing the arrangement of carriers when a trouble occurs in the resist pattern forming system.

In the above-described example, the carrier C1 for the lot L1 and the carrier C6 for the lot L6 are mounted on the carry-in delivery mounting unit 212 or the carry-out delivery mounting unit 213 as shown in FIG. 9 and FIG. 11A. Therefore, the wafers in the lot L1 and the wafers in the lot L6 are just returned to the carrier C1 and the carrier C6 without performance of the moving and mounting work of those carriers. Note that FIG. 11A to FIG. 11D show the positions of the mounting stage 24 as seen from the carrier carry mechanism 3 side.

Figure 11B:
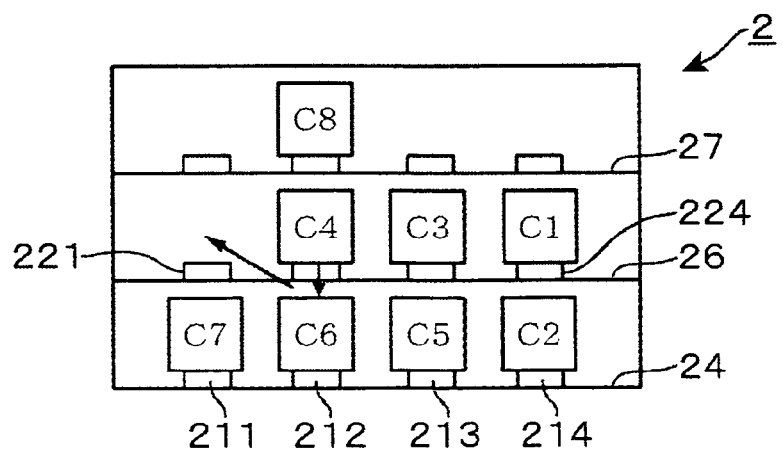
FIG. 11B and FIG. 11C are process charts each showing the state in which the carrier into which wafers have been collected is moved to a retreat mounting unit and the carrier corresponding to the wafers which are to be collected is moved to a delivery mounting unit.

Then, the wafers in the lot L5 are collected, but the carrier C5 for the lot L5 is not mounted on the delivery mounting unit 211 to 214. Therefore, for example, the carrier C1 is moved to and mounted on the vacant retreat mounting unit 224 and the carrier C5 is then moved to and mounted on the delivery mounting unit 213 as shown in FIG. 11A and FIG. 11B to collect the wafers W in the lot L5 into the carrier C5. Subsequently, the wafers in the lot L2 are collected. The carrier C2 for the lot L2 is mounted on the delivery mounting unit 214, and therefore the wafers in the lot L2 are just collected into the carrier C2.

Figure 11C:
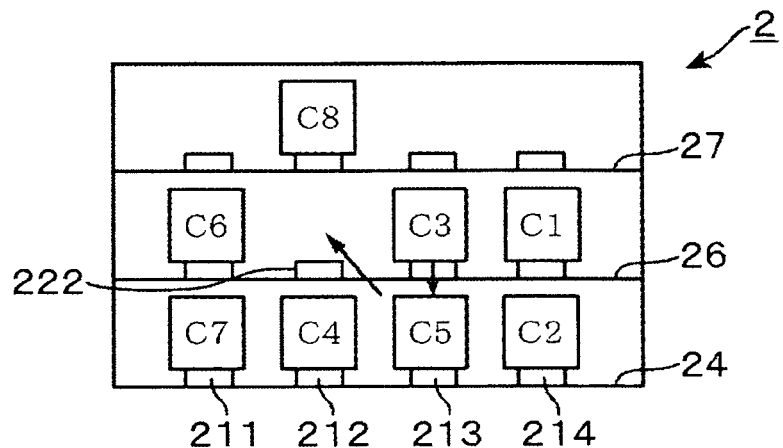
Figure 11D:
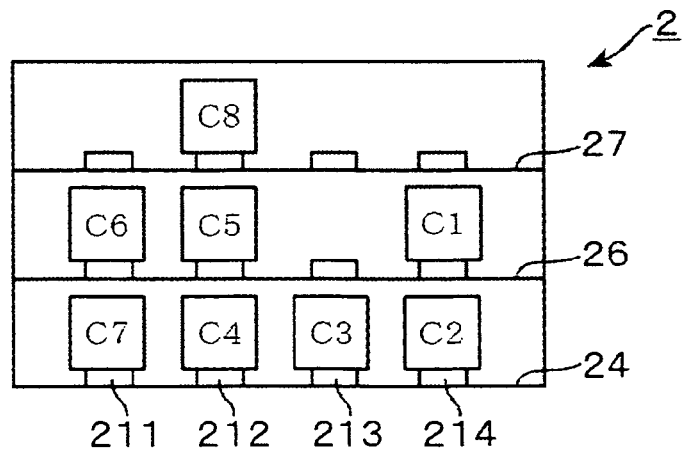
FIG. 11D is a process chart showing the arrangement of the carriers when all of the wafers have been collected.

Subsequently, the wafers in the lot L4 are collected, but the carrier C4 for the lot L4 is not mounted on the delivery mounting unit 211 to 214. Therefore, for example, the carrier C6 is moved to and mounted on the vacant retreat mounting unit 221 and the carrier C4 is moved to and mounted on the delivery mounting unit 212 as shown in FIG. 11B and FIG. 11C to collect the wafers in the lot L4 into the carrier C4. Subsequently, the wafers in the lot L3 are collected, but the carrier C3 for the lot L3 is not mounted on the delivery mounting unit 211 to 214. Therefore, for example, the carrier C5 is moved to and mounted on the vacant mounting unit 222 and the carrier C3 is moved to and mounted on the delivery mounting unit 213 as show in FIG. 11C and FIG. 11D to collect the wafers in the lot L3 into the carrier C3. After the collection work of the wafers W is executed as described above, the operator turns off the power to the system to shut down it (Step S6).

According to the above embodiment, the stocker 25 for temporarily storing the carriers C is provided in the carrier station 2, many mounting units for the carriers C are arranged in the stocker 25, and the mounting units also serve as the retreat mounting units 22 for allowing the carriers C to retreat thereto, thereby enhancing the utility value of the stocker 25. More specifically, even when the number of wafers to be housed in one carrier C is small due to manufacturing of a wide variety of products in small quantities, it is possible to take the wafers out of the carrier C placed on the delivery mounting unit 21, then retreat the carrier C to the retreat mounting unit 22, move and mount a new carrier C to and on the delivery mounting unit 21, and take the wafers therein out of it. This can increase the total number of the wafers to be taken out of the carrier mounting section B1 to the treatment section B2. Accordingly, occurrence of a situation in which wafers cannot be supplied to all of the modules which could normally perform treatments can be prevented, thereby suppressing a reduction in operating rate of the modules in the treatment section B2 and the aligner B4, so that the reduction in throughput can be suppressed.

Further, the collection schedule is created to collect the wafers W sequentially starting from the wafer W closer to the carrier mounting section B1 for collecting the wafers W placed in the treatment section B2 and the aligner B4 into the original carriers C when a trouble such as a failure or the like of the modules or the carry system occurs in the coating and developing apparatus, so that the collection work of the wafers W can be quickly performed. Further, in collecting the wafers W in a lot, if the carrier corresponding to the wafers W is not placed on the delivery mounting unit 21, the carrier is moved from the retreat mounting unit 22 and mounted on the delivery mounting unit 21 by the carrier carry mechanism 3, so that the collection work of the wafers W can be surely performed without generating confusion such a situation in which the original carrier to which the wafers W are to be returned does not exist on the delivery mounting unit 21.

Figure 12:
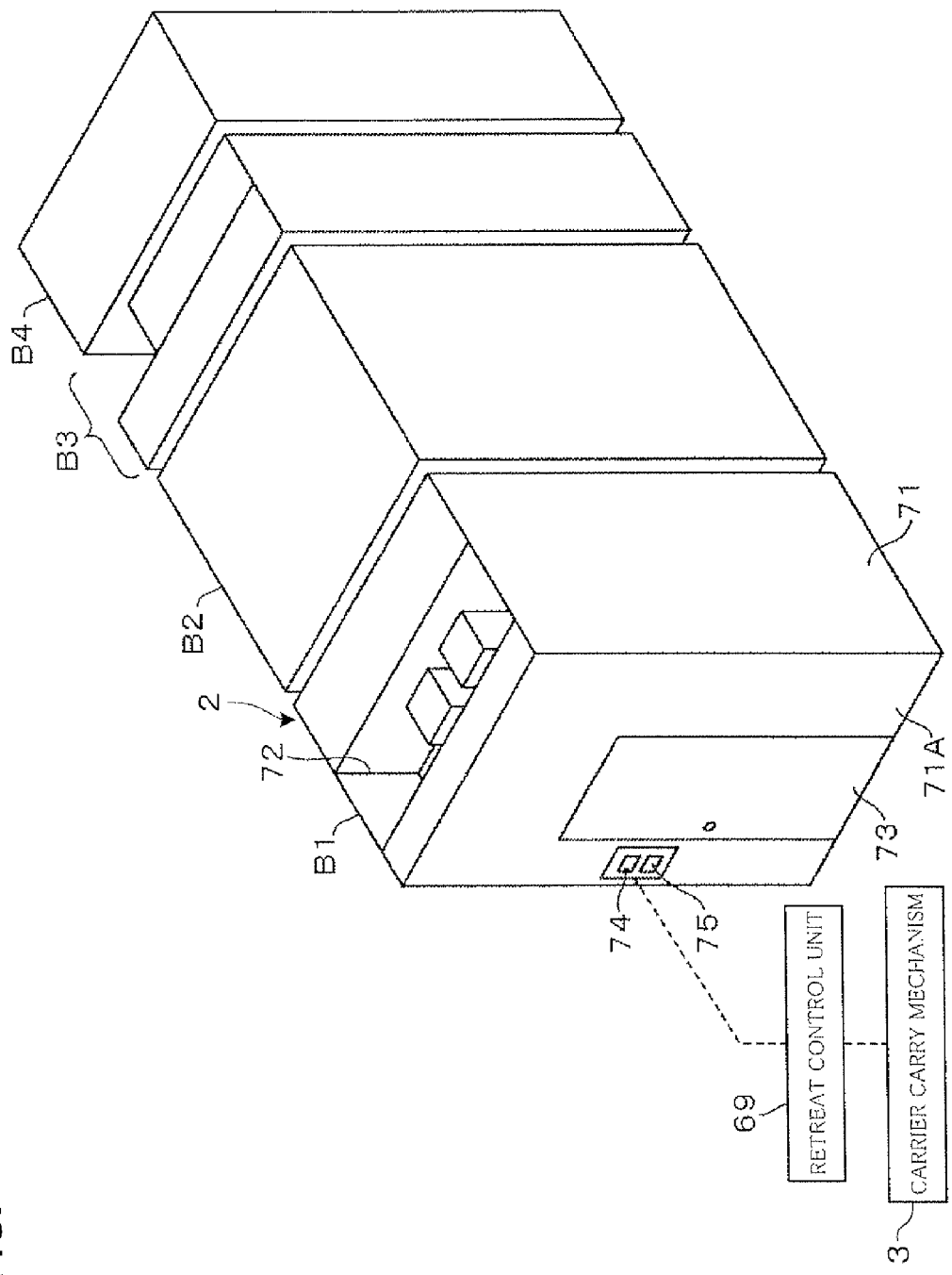
FIG. 12 is a perspective view showing another embodiment of the present invention.
Figure 13:
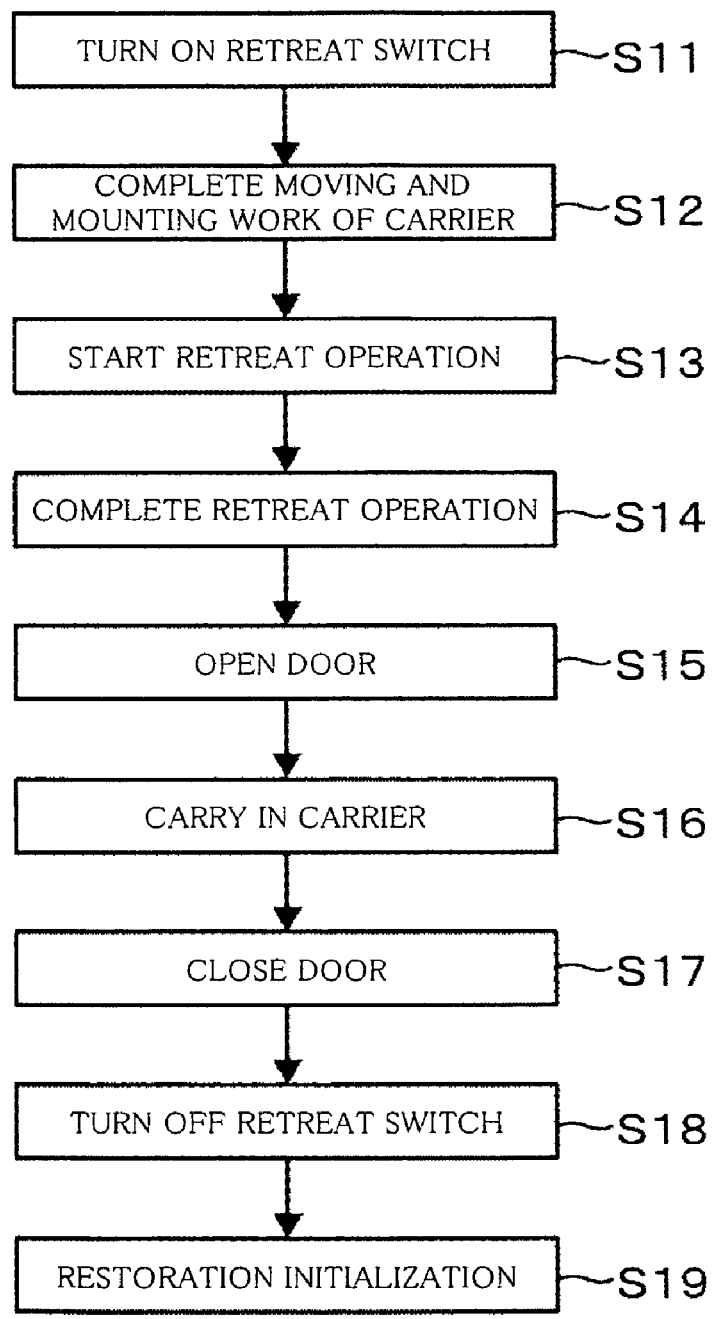
FIG. 13 is a flowchart for explaining the operation of the other embodiment of the present invention.

Next, another embodiment of the present invention will be described referring to FIG. 12 to FIG. 14. As shown in FIG. 12, the side periphery and the ceiling portion of the carrier mounting section B1 are enclosed by a wall portion 71. The ceiling portion is formed with an opening 72 to allow the external carrier carry mechanism 200 to access the carry-in/out mounting unit. The wall portion 71 is provided with a door 73 for the operator to enter and exit the carrier mounting section B1. In this example, the door 73 is provided in a wall portion 71A opposite the carrier station 2, and a retreat switch 74 and a pause switch 75 which are operated by the operator are provided near the door 73.

The retreat switch 74 is a device for outputting a retreat command to the carrier carry mechanism 3. Based on the command, the retreat control unit 69 in the control unit 6 controls the carrier carry mechanism 3 which is performing the moving and mounting work of the carrier C so that the carrier carry mechanism 3 moves to the retreat region 30 after execution of the moving and mounting work. The retreat switch 74 is configured to notify the operator of completion of the movement by a change of the color of the retreat switch 74, for example, when the movement of the carrier carry mechanism 3 to the retreat region 30 is completed. In this example, the retreat switch 74 and the retreat control unit 69 constitute a device for controlling the carrier carry mechanism 3 performing the moving and mounting work of the carrier C so that the carrier carry mechanism 3 moves to the retreat region 30 after execution of the moving and mounting work.

Next, the operation of this embodiment will be described referring to FIG. 13. This embodiment is used when the operator opens the door 73 and enters the carrier mounting section B1. A case where the operator carries the carrier C directly into the delivery mounting unit 21 will be described here by way of example. First, the operator turns on the retreat switch 74 before opening the door 73 (Step S11). This causes a retreat command to be outputted to the retreat control unit 69. Note that, by the retreat control unit 69, the carrier carry mechanism 3 when performing the moving and mounting work, completes the moving and mounting work of the carrier C (Step S12), and then starts the retreat operation to the retreat region 30 (Step S13). After completion of the retreat operation (Step S14), for example, the retreat switch 74 is controlled to change its color.

Then, the operator verifies the completion of the retreat operation of the carrier carry mechanism 3 by the color of the retreat switch 74, and then opens the door 73 (Step S15), enters the carrier mounting section B1 and carries a carrier C to the delivery mounting unit 21 (Step S16). Thereafter, the operator exits the carrier mounting section B1 and closes the door 73 (Step S17), and turns off the retreat switch 74 (Step S18). Then, restoration initialization is performed (Step S19). The restoration initialization means that the movable portions of the machine are returned back to their home positions and the original positions are verified.

In this event, control is conducted by the retreat control unit 69 such that when the door 73 is opened with the retreat switch 74 turned on, the power to the carrier carry mechanism 3 is turned off, and when the door retreat switch 74 is turned off, the power to the carrier carry mechanism 3 is turned on. Further, when the carrier carry mechanism 3 is not holding any carrier, the carrier carry mechanism 3 is controlled to immediately retreat to the retreat region 30. The reason why the control is conducted such that the power to the carrier carry mechanism 3 is turned off when the door 73 is opened and the power to the carrier carry mechanism 3 is turned on when the retreat switch 74 is turned off is that the bodily injury caused by the robot being the carry mechanism has to be prevented. Further, the above-described control is conducted for automatization to immediately restore production activities.

According to this embodiment, the operator turns on the retreat switch 74 before entering the carrier mounting section B1, whereby the carrier carry mechanism 3 moves to the retreat region 30 after completion of the current moving and mounting work. Thus, the restoration initialization is performed on the carrier carry mechanism 3 existing in the retreat region 30, so that time until the restoration initialization is started is reduced. In contrast, the retreat switch 74 is not provided in the prior art. Therefore, when the operator is about to open the door 73 and enter the carrier mounting section B1, the carrier carry mechanism 3 holding the carrier C moves to the retreat region 30, and after the operator exits the carrier mounting section B1, the carrier carry mechanism 3 continues the moving and mounting work on the carrier C held by the carrier carry mechanism 3 and moves again to the retreat region 30 after completion of the moving and mounting work. The restoration initialization is performed thereafter. Therefore, it takes time until the restoration initialization is started. Note that in this embodiment, in stead of providing the retreat switch 74, a retreat command may be issued to the retreat control unit 69 when the operator is about to open the door 73 so as to perform the retreat operation of the carrier carry mechanism 3.

Figure 14:
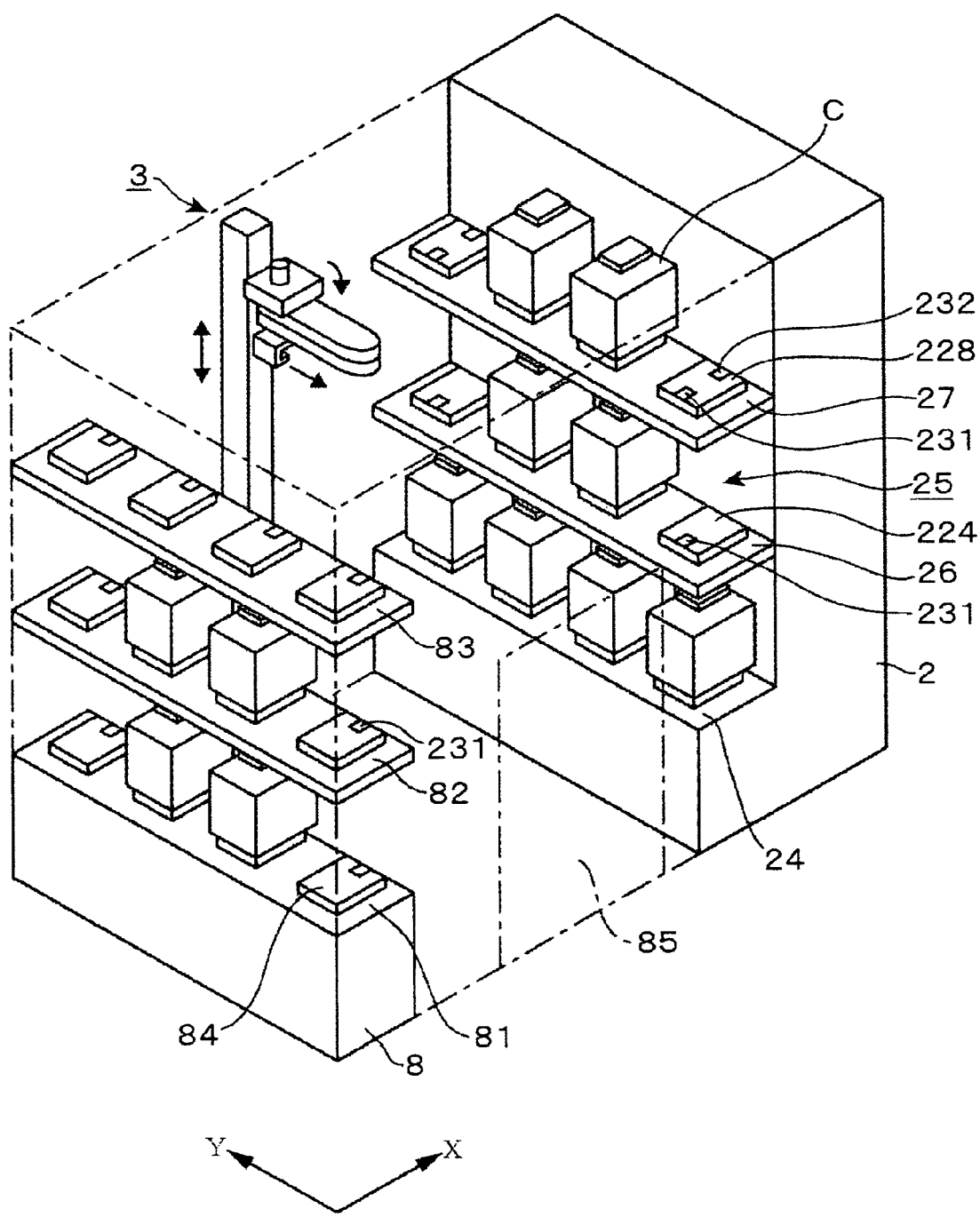
FIG. 14 is a perspective view showing the carrier mounting section in still another embodiment of the present invention.

Note that in the present invention, a carrier stocker 8 constituting a storage unit for temporarily storing the carriers C may be provided on the opposite side to the carrier station 2 across the carrier carry mechanism 3 in the carrier mounting section B1 as shown in FIG. 14. Also in the carrier stocker 8, for example, shelf units 81 to 83 are provided in three tiers in the vertical direction as in the carrier station 2. In each of the shelf units 81 to 83, four mounting units 84 also serving as retreat mounting units for mounting the carriers C thereon are arranged side by side in the Y-direction in the drawing. The carrier carry mechanism 3 is configured to be able to move and mount the carrier C also to and on each of the mounting units 84 in the carrier stocker 8. The mounting units 84 provided in the carrier stocker 8 are provided, for example, with position sensors 231. FIG. 14 is drawn with the rear wall in the carrier stocker 8 holding the shelf units 81 to 83 omitted for convenience of illustration. When the carrier stocker 8 is provided as described above, for example, a door 85 is provided to open in a moving region of the carrier carry mechanism 3 between the carrier station 2 and the carrier stocker 8. Near the door 85, a not-shown retreat switch is provided.

Figure 15:
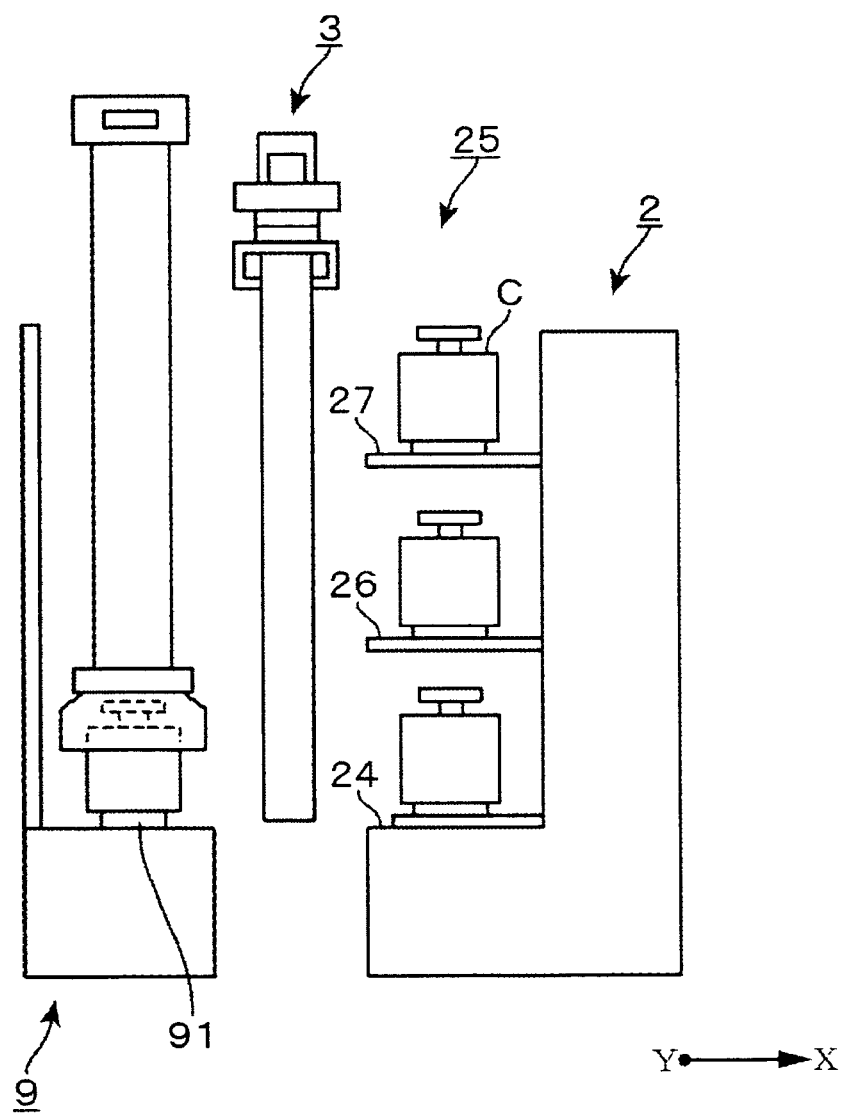
FIG. 15 is a sectional view showing the carrier mounting section in the still other embodiment of the present invention.
Figures 16, 17:
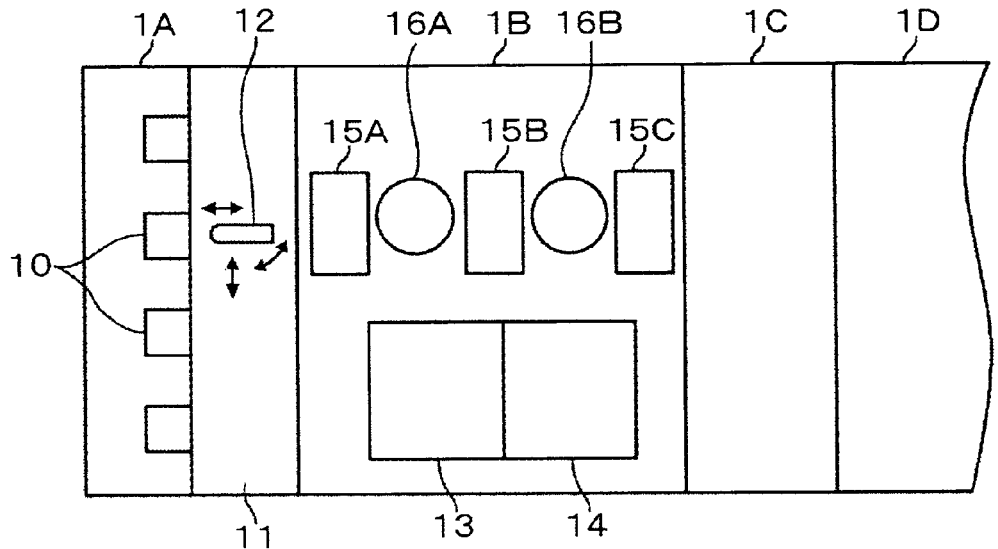
FIG. 16 is a plan view showing a conventional coating and developing apparatus.
FIG. 17 is a configuration chart showing one example of a carry schedule in the prior art.

Further, as shown in FIG. 15, a carrier carry-in/out stage 9 may be provided on the side opposite to the carrier station 2 across the carrier carry mechanism 3 in the carrier mounting section B1. In the carrier carry-in/out stage 9, a plurality of carry-in/out mounting units 91 for mounting the carriers C thereon are arranged side by side in the Y-direction in the drawing. The external carrier carry mechanism 200 is configured to access the carry-in/out mounting units 91 so that the carriers C are carried in/out between the carrier mounting section B1 and the external part.

The present invention is also applicable to a coating and developing apparatus which treats not only the semiconductor wafer but also a substrate such as a glass substrate (LCD substrate) for a liquid crystal display. Further, the shape of the carrier carry mechanism 3 is not limited to the above-described one. The configuration of the storage unit (stocker) temporarily storing the carriers is not limited to that in the above-described example. The mounting units for carriers may be provided below the delivery stage 24. Further, in the mounting units in the storage unit, a carrier C housing untreated wafers W, a carrier housing treated wafers W, a vacant carrier and the like are temporarily stored, and all of the mounting units are not necessarily used as the retreat mounting units. Furthermore, the delivery mounting unit may serve both as the mounting unit used when the wafers W are carried from the carrier mounting section into the treatment section and as the mounting unit used when the wafers W are carried out of the treatment section B2 to the carrier mounting section B1. The number of delivery mounting units accessed by the delivery mechanism is arbitrarily selected.

What is claimed is:

1. A coating and developing apparatus forming a coating film on each of substrates taken out of carriers, each carrier housing a plurality of substrates and being prepared for each lot, performing developing treatment on the substrates after exposure, and carrying the substrates which have been subjected to the developing treatment back to original carriers in which the substrates were housed, said apparatus comprising:

a treatment section comprising a plurality of modules treating the substrates taken out of the carriers, and a substrate carry mechanism carrying the substrates between said plurality of modules;

a carrier mounting section comprising a delivery mounting unit on which the carrier is to be mounted, and a delivery mechanism delivering the substrates between the carrier mounted on said delivery mounting unit and said treatment section;

a plurality of retreat mounting units provided in said carrier mounting section, on which the carriers are to be mounted;

a carrier carry mechanism moving and mounting the carriers between said retreat mounting units and said delivery mounting unit;

a collection control unit determining a collection order for collecting the substrates in said modules into the original carriers in which the substrates were housed, when a trouble occurs in said coating and developing apparatus; and a carry control unit configured to control, after said trouble occurs in said coating and developing apparatus, said carrier carry mechanism to move and mount the carriers between said delivery mounting unit and said retreat mounting units according to the determined collection order, and controlling said delivery mechanism and said substrate carry mechanism to carry the substrates to the carrier in which the substrates were housed on said delivery mounting unit according to the determined collection order.

2. The coating and developing apparatus as set forth in claim 1, further comprising:
a carry schedule storage unit storing a carry schedule created by arranging, in time sequence, data of carry cycles of moving the substrates in said modules one by one by said substrate carry mechanism,
wherein said collection control unit determines the collection order of the substrates based on the carry schedule.

3. The coating and developing apparatus as set forth in claim 1, wherein the collection order of the substrates is determined to collect the substrates into the carriers in order starting from the substrate placed in said module closer to said carrier mounting section.

4. The coating and developing apparatus as set forth in claim 1, wherein said carrier mounting section comprises a storage unit for temporarily storing the plurality of carriers, and said plurality of retreat mounting units are provided in said storage unit.

5. The coating and developing apparatus as set forth in claim 4, wherein said storage unit is provided above or below said delivery mounting unit.

6. The coating and developing apparatus as set forth in claim 4, wherein said storage unit is provided opposite said delivery mounting unit across said carrier carry mechanism.

7. The coating and developing apparatus as set forth in claim 4, wherein said retreat mounting units in said storage unit include a carry-in/out mounting unit used when the carrier is delivered between said storage unit and an external part thereof, and said carrier carry mechanism moves and mounts the carrier between said carry-in/out mounting unit and another of said retreat mounting units in said storage unit or said delivery mounting unit.

8. The coating and developing apparatus as set forth in claim 1, wherein said collection control unit is configured to control said carry control unit and thereby said carrier carry mechanism, said delivery mechanism and said substrate carry mechanism to move carriers that are collection destination of substrates and to carry the substrates to the carriers where the substrates were originally housed.

9. The coating and developing apparatus as set forth in claim 1, wherein carrier carry mechanism is provided on a side of the delivery mounting unit opposite to the treatment section.

10. The coating and developing apparatus as set forth in claim 1 wherein, after said trouble occurs in said coating and developing apparatus, said control unit is configured to control said carrier carry mechanism, said delivery mechanism and said substrate carry mechanism to retrieve said substrates and carriers in the following order:
said carriers each housing untreated substrates are carried in order by said carrier carry mechanism to said delivery mounting units, and
said substrates are taken out by said delivery mechanism from the carriers to said treatment section side in the order that the carriers have been carried in.

11. The coating and developing apparatus as set forth in claim 1, wherein after said trouble occurs in said coating and developing apparatus, said control unit is configured to control said carrier carry mechanism, said delivery mechanism and said substrate carry mechanism to retrieve said substrates and carriers in the following order:
the carrier from which all of the substrates have been taken out is temporarily moved and mounted on said retreat mounting unit by said carrier carry mechanism,
an original carrier is carried from said retreat mounting unit to said delivery mounting unit for returning the treated substrates into the original carrier, and
after all treated substrates are house in the original carrier, the carrier is then carried out of said delivery mounting unit by said carrier carry mechanism.

12. The coating and developing apparatus as set forth in claim 1, wherein after said trouble occurs in the coating and developing apparatus:
in order to deliver one carrier, from which all of the substrates were removed and which was temporarily moved and mounted on said retreat mounting unit, to said delivery mounting unit and collect substrates therein according to the collection order determined by said collection control unit;
another carrier, which is mounted on said delivery mounting unit, is returned to said retreat mounting unit by said carrier carry mechanism, the one carrier is moved and mounted by said carrier carry mechanism on said delivery mounting unit vacated by the another carrier, and the substrates are collected into the one carrier.

13. A coating and developing apparatus forming a coating film on each of substrates taken out of carriers, each carrier housing a plurality of substrates and being prepared for each lot, performing developing treatment on the substrates after exposure, and carrying the substrates which have been subjected to the developing treatment back to original carriers in which the substrates were housed, said apparatus comprising:
a treatment section comprising a plurality of modules treating the substrates taken out of the carriers, and a substrate carry mechanism carrying the substrates between said plurality of modules;
a carrier mounting section comprising a delivery mounting unit on which the carrier is to be mounted, and a delivery mechanism delivering the substrates between the carrier mounted on said delivery mounting unit and said treatment section, said carrier mounting section including a storage unit for temporarily storing a plurality of carriers;
a plurality of retreat mounting units provided in said carrier mounting section, on which the carriers are to be mounted, and said plurality of retreat mounting units being provided in said storage unit of said carrier mounting section;
a carrier carry mechanism moving and mounting the carriers between said retreat mounting units and said delivery mounting unit;
a collection control unit determining, when a trouble occurs in said coating and developing apparatus, a collection order for collecting the substrates in said modules into the original carriers in which the substrates were housed, and the collection order of the substrates being determined to collect the substrates into the carriers in order starting from the substrate placed in said module closer to said carrier mounting section; and
a carry control unit controlling, after said trouble occurs in said coating and developing apparatus, said carrier carry mechanism to move and mount the carriers between said delivery mounting unit and said retreat mounting units according to the determined collection order, and controlling said delivery mechanism and said substrate carry mechanism to carry the substrates to the carrier in which the substrates were housed on said delivery mounting unit according to the determined collection order.

14. The coating and developing apparatus as set forth in claim 13, further comprising:

a carry schedule storage unit storing a carry schedule created by arranging, in time sequence, data of carry cycles of moving the substrates in said modules one by one by said substrate carry mechanism, wherein said collection control unit determines the collection order of the substrates based on the carry schedule.

15. The coating and developing apparatus as set forth in claim 13, wherein said storage unit is provided above or below said delivery mounting unit.

16. The coating and developing apparatus as set forth in claim 13, wherein said storage unit is provided opposite said delivery mounting unit across said carrier carry mechanism.

17. The coating and developing apparatus as set forth in claim 13, wherein said retreat mounting units in said storage unit include a carry-in/out mounting unit used when the carrier is delivered between said storage unit and an external part thereof, and said carrier carry mechanism moves and mounts the carrier between said carry-in/out mounting unit and another of said retreat mounting units in said storage unit or said delivery mounting unit.

18. An apparatus for individually treating substrates held in carriers, the carriers each housing a plurality of substrates, removing each substrate from each carrier and physically treating each substrate relative to a lot designation of each carrier, and after treatment returning the substrates to original carriers in which the substrates were housed, the apparatus comprising:

a treatment section means including a plurality of modules for treating the substrates removed from the carriers, and a substrate carry means for carrying the substrates between the plurality of modules;

a plurality of carriers respectively housing a plurality of substrates, a carrier mounting means for holding the carriers in an accessible manner, the carrier mounting means including a delivery mounting means for individually extracting each substrate from the plurality of carriers and delivering each substrate to the treatment section means, the delivery mounting means also for individually retrieving each substrate from the treatment section means and delivering each substrate respectively into each carrier;

a carrier carry means moving and mounting the carriers between the carrier mounting means and the delivery mounting means; and a collection control means for determining a collection order for retrieving the substrates from the treatment section means by said delivery mounting means and delivering the substrates into the original carriers in which the substrates were held, when a trouble occurs in said apparatus; and a carry control means for controlling, after said trouble occurs in said apparatus, said carrier carry means for moving, mounting and holding the carriers according to the determined collection order, and controlling said delivery mounting means to deliver the substrates to the carrier in which the substrates were originally held by said carrier carry means, according to the determined collection order.

19. The apparatus as set forth in claim 18, wherein the carrier mounting means comprises a storage unit for temporarily storing the plurality of carriers and a plurality of retreat mounting units are provided in the storage unit.

20. The apparatus as set forth in claim 18, wherein carrier carry means is provided on the side of the delivery mounting means opposite to the treatment section means.

\* \* \* \* \*